(12) United States Patent
Kram et al.

(10) Patent No.: US 8,785,860 B2
(45) Date of Patent: Jul. 22, 2014

(54) SENSOR PART FOR AN INFRARED SENSOR AND METHOD FOR PRODUCING SAME

(75) Inventors: Martin Kram, Gerolzhofen (DE); Gehard Rohner, Hemsbach (DE)

(73) Assignee: Schaeffler Technologies GmbH & Co. KG, Herzogenaurach (DE)

( * ) Notice: Subject to any disclaimer, the term of this patent is extended or adjusted under 35 U.S.C. 154(b) by 0 days.

(21) Appl. No.: 13/641,200

(22) PCT Filed: Apr. 6, 2011

(86) PCT No.: PCT/EP2011/055299
§ 371 (c)(1),
(2), (4) Date: Dec. 12, 2012

(87) PCT Pub. No.: WO2011/141237
PCT Pub. Date: Nov. 17, 2011

(65) Prior Publication Data
US 2013/0075616 A1 Mar. 28, 2013

(30) Foreign Application Priority Data
Apr. 15, 2010 (DE) .......................... 10 2010 015 084

(51) Int. Cl.
*G01J 5/04* (2006.01)
(52) U.S. Cl.
CPC ......................................... *G01J 5/04* (2013.01)
USPC ...................................................... 250/349
(58) Field of Classification Search
CPC ........................................................ G01J 5/04
USPC ........................... 250/343, 348, 349; 29/592.1
See application file for complete search history.

(56) References Cited

FOREIGN PATENT DOCUMENTS

WO 2009041724 4/2009

OTHER PUBLICATIONS

Jong et al, "3D Integration with PCB Technology," Mar. 2006, Applied Power Electronics Conference adn Exposition, 2006. APEC '06. Twenty-First Annual IEEE, pp. 857-863.*

* cited by examiner

*Primary Examiner* — David Porta
*Assistant Examiner* — Faye Boosalis
(74) *Attorney, Agent, or Firm* — Volpe and Koenig, P.C.

(57) ABSTRACT

A sensor part for an infrared sensor, including an IR-sensitive detector (1), at least one reference source (2) emitting IR radiation, and an IR-sensitive reference detector (3) which, in the direction of the incident IR radiation, is at a distance from the detector (1), wherein the at least one reference source (2) is arranged at the side of the reference detector (3), and including a support (5), on the first side (6) of which the detector (1), the at least one reference source (2) and the reference detector (3) are arranged. The support (5) includes a blank made of a flexible material bent in some sections, in particular a blank made of a flexible printed circuit board bent in some sections. The invention achieves the aim of specifying a three-dimensional sensor part for an IR sensor that can be produced by a simple method. The invention further relates to a method for producing a sensor part and to an IR sensor.

12 Claims, 3 Drawing Sheets

SENSOR PART FOR AN INFRARED SENSOR AND METHOD FOR PRODUCING SAME

BACKGROUND

The invention relates to a sensor part, including an IR-sensitive detector, at least one reference source that emits IR radiation, and an IR-sensitive reference detector. The invention further relates to an IR sensor and a method for producing the sensor part.

Three-dimensional structured sensor parts for IR sensors are known from the prior art and take the form for example of a semiconductor substrate as the support for the detector, the reference detector and the reference source. The production of sensor parts of this kind is complex, in particular as regards mass production.

It is true that MID (molded interconnect device) technology can be used to manufacture three-dimensional electronic components, for example by hot stamping, laser structuring, the use of masks or films that are injection molded behind the components; but sensor parts for IR detectors cannot be manufactured reliably in large numbers because of their only small dimensions (a few millimeters for the sensor part as a whole and in some cases less than 1 millimeter for the detectors and reference sources).

SUMMARY

It is the object of the invention to specify a three-dimensional sensor part, capable of being produced by a simple method, for an IR sensor.

This object is achieved according to the invention by a sensor part having one or more features of the invention.

The support on a first side on which the detector, the at least one reference source and the reference detector are arranged, includes a blank of a flexible material whereof certain sections are bent, in particular a blank of a flex circuit board of which certain sections are bent, can be provided as a substantially planar, two-dimensional blank, wherein the three-dimensional sensor part is constructed as the method proceeds to be performed, by bending or arching sections of the body of the support.

Large numbers of flex circuit boards, on which the detector, the reference detector and the at least one reference source are secured on a common first side, are available and already have the electrical connections that can connect the detector, the reference detector and the at least one reference source to one another or to a downstream electronics unit. The detector, the reference detector and the at least one reference source may be secured to flex circuit boards of this kind by means of adhesive and electrically connected by means of bonding.

Preferably, it is provided for the body of the support to include a main section, which extends in the direction of incident radiation, and a detector section, wherein the detector is arranged on the detector section, and wherein the detector section projects away from the main section at a second bending edge at an angle, in particular substantially a right angle. When the method is performed, in one of the method steps the detector section is moved away from the main section of the body of the support by bending, thus forming the second bending edge.

Preferably, it is provided for the body of the support to include a main section, which extends in the direction of incident radiation, and a reference section, wherein the reference section is arranged on a projecting arm, wherein the projecting arm is connected to the main section, and wherein the reference section projects away from the projecting arm at a first bending edge at an angle, in particular substantially a right angle. When the method is performed, in this case in one of the method steps the reference section is moved away from the projecting arm by bending, forming the first bending edge, wherein the arched projecting arm ensures that the detector section, which is bent around the second bending edge, is arranged at a spacing from the reference section in the direction of the incident ray. The detector section and the reference section are in this case constructed as substantially parallel sections—which are offset in the direction of the incident ray and along the extent of the main section of the body of the support—of a three-dimensional sensor part that previously took the form of a two-dimensional flat blank to which the detector, the reference detector and the at least one reference source were already secured.

Preferably, it is provided for the reference section to have an outline in the shape of a circle segment. The outline in the shape of a circle segment ensures that the reference section and the finished sensor part can be received in a sleeve that is a component part of the IR sensor. A radius of the circle segment of the outline is selected, with respect to the bending radius of the projecting arm, which is arched into an annular segment, such that the reference section is received within the projecting arm.

Preferably, it is provided for the projecting arm to be bent in the shape of an annular segment. The bent projecting arm delimits the sensor part to the side and bears for example under pre-tension against an inner wall of a sleeve in which the sensor part as a whole is arranged.

Preferably, it is provided for the projecting arm to take a substantially L-shaped form, wherein the reference section is arranged at one end of the short arm, and wherein the main section is arranged at one end of the long arm. The L-shaped form of the projecting arm ensures that, once the first bending edge has been formed and the long section of the projecting arm has been bent to form the annular segment, the reference section is substantially parallel to the detector section and is arranged offset therefrom in the direction of the incident ray.

Preferably, it is provided for the sensor part to include a mirror element, wherein the mirror element is arranged on a second side of the support opposing the first side of the support, opposite the reference detector and the at least one reference source.

With respect to the mirror element, it is preferably provided for the mirror element to be arranged on the opposite side of the detector section to the detector. Particularly preferably with respect to the mirror element, it is provided for the mirror element to be formed by a section of the material of the support, in particular by an exposed metal section of a flex circuit board that includes a metal layer.

Preferably, it is provided for the main section to have a convex shape transversely in relation to its extent. The convex main section of the body of the support gives the sensor part more rigidity and may for example bear against the sleeve in which the sensor part is received in order to form the IR sensor.

Preferably, it is provided for the main section to include a broadened section. Further electronic elements may be provided on this broadened section; in particular, the flat blank of the support may be provided with the electronic elements before the bending edges or the arching of the projecting arm are formed, or before the main section is made convex. The broadened section also contributes to giving the sensor part such mechanical rigidity that further processing of the sensor part to form the sensor the handling is simplified.

The invention further relates to a method by means of which the sensor part may for example be produced, having the following steps:

- providing a substantially flat section of a flexible material, in particular a flat section of a flex circuit board, as the support,
- securing an IR-sensitive detector to a first section of the body of the support, in particular to a detector section of the body of the support,
- securing at least one reference source that emits IR radiation and an IR-sensitive reference detector to a second section of the body of the support, in particular to a reference support, wherein the second section or the reference support is connected to a main section of the body of the support by way of a projecting arm,
- forming a first bending edge by means of which the second section is moved away from the projecting arm,
- a. arching the projecting arm to form an annular segment,
- forming a second bending edge by means of which the first section is moved away from the rest of the body of the support, in particular by means of which the detector section is moved away from the main section,
- wherein the formation of the first bending edge, the second bending edge and the arching of the projecting arm are performed such that the detector is spaced in the direction of incidence of the radiation from the moved-away section having the reference sensor and the at least one reference source.

In this method, from a starting point of a flat, two-dimensional support, to which the detector, the reference detector and the at least one reference source are fitted while it is still a flat starting product, wherein any desired order of fitting is possible, thereafter by forming the two bending edges and arching the projecting arm a three-dimensional end product is generated which may be installed in an IR sensor as the sensor part. The precise order in which the first bending edge or the second bending edge is formed or the projecting arm is arched to form the annular segment is not decisive here.

Further advantages and features of the invention will emerge from the dependent claims and the description of an exemplary embodiment.

BRIEF DESCRIPTION OF THE DRAWINGS

The invention will be explained and described in more detail below with reference to the attached drawings.

DETAILED DESCRIPTION OF THE PREFERRED EMBODIMENTS

Figure 1:
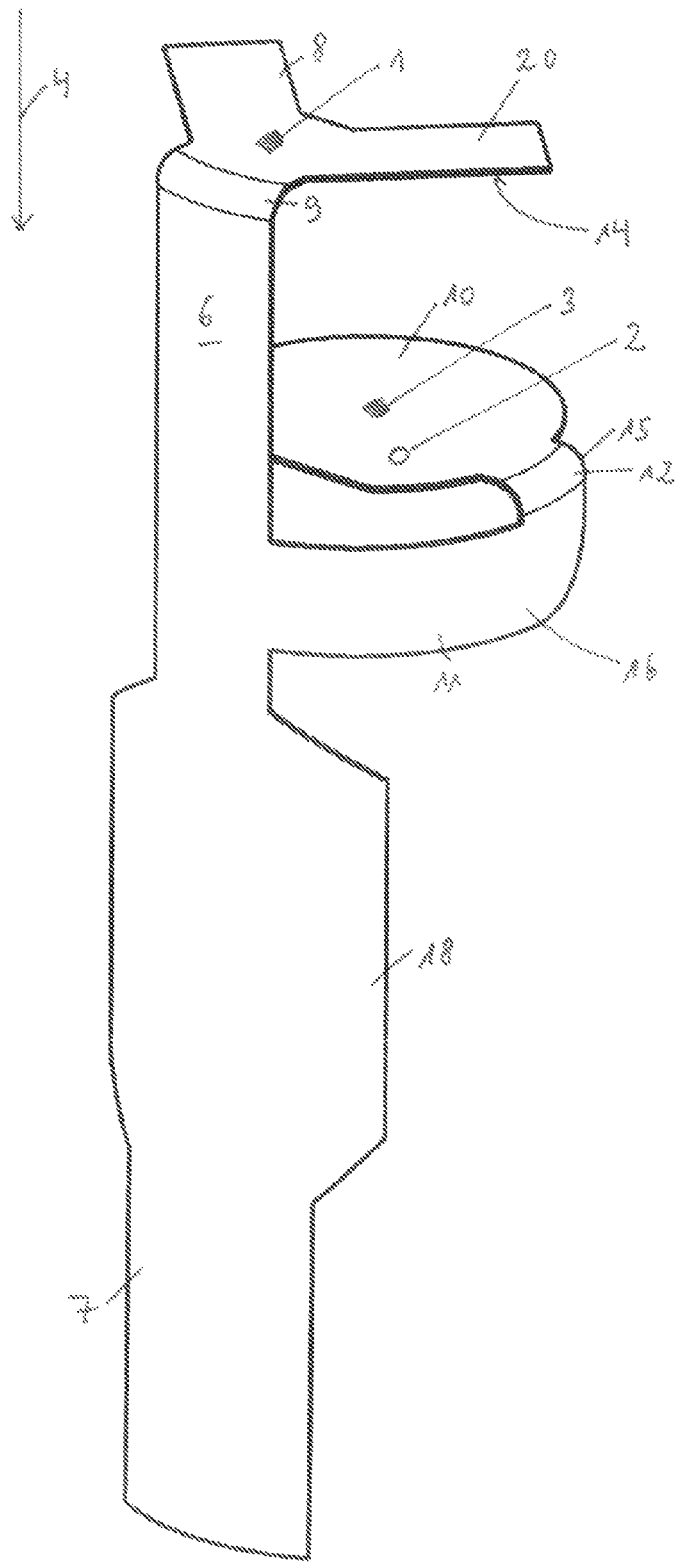
FIG. 1 shows a perspective view of an exemplary embodiment of a sensor part according to the invention, produced by performing, in a manner given by way of example, the method according to the invention.

FIG. 1 shows a sensor part for an infrared sensor (not illustrated in further detail), wherein the body of the sensor part includes an IR-sensitive detector 1, a plurality of reference sources that emit IR radiation and of which only one is illustrated, designated by the reference numeral '2', and an IR-sensitive reference detector 3 that is spaced from the detector 1 in the direction of incident IR radiation (arrow 4). The reference source 2 is arranged to the side of the reference detector 3. The sensor part further includes a support 5, wherein the detector 1, the reference source 2 and the reference detector 3 are arranged on a surface of the first side 6. The support 5 comprises a blank of a flexible material whereof certain sections are bent, in particular a bent blank of a flex circuit board.

The body of the support 5 includes a main section 7, which extends in the direction of incident radiation (arrow 4), and a detector section 8, wherein the detector 1 is arranged on the detector section 8, and wherein the detector section 8 projects away from the main section 7 at a second bending edge 9 at an angle, in particular substantially a right angle.

The body of the support 5 includes, in addition to the main section 7 that extends in the direction of incident radiation (arrow 4), a reference section 10, wherein the reference section 10 is arranged at one end of a projecting arm 11, wherein the projecting arm 11 is connected to the main section 7, and wherein the reference section 10 projects away from the projecting arm 11 at a first bending edge 12 at an angle, in particular substantially a right angle. In this case, the reference section 10 has an outline substantially in the shape of a circle segment, wherein the circle segment covers an angle of approximately 300°. The circle segment of the outline is interrupted by a straight section 13, which points toward a second side 14 of the main section 7 of the body of the support 5 and forms a narrow gap with the second side 14. The radius of the circle segment of the reference section is approximately 4 millimeters.

Figure 3:
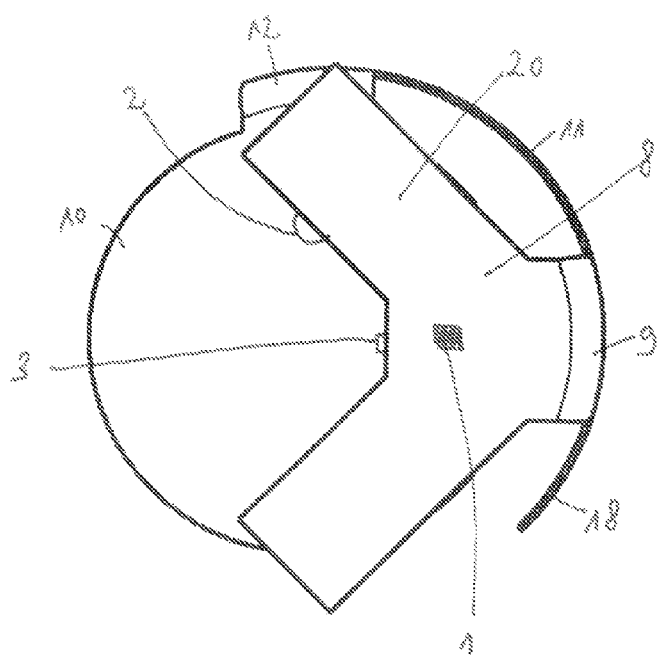
FIG. 3 shows a plan view of the exemplary embodiment from FIGS. 1 and 2.

The projecting arm 11, which connects the main part 7 to the reference part 10, is bent in the shape of an annular segment, wherein an angle of somewhat less than approximately 90° is covered (FIG. 3).

The projecting arm 11 takes a substantially L-shaped form, wherein the reference section 10 is arranged at one end of the short arm 15 of the projecting arm 11, and wherein the main section 7 is arranged at one end of a long arm 16. The length of the short arm 15 of the projecting arm 11 is dimensioned such that the first bending edge 12 is formed entirely within the short arm 15, and in particular the first bending edge 12 extends entirely within the short arm 15. This ensures that when the material is bent, during which the first bending edge 12 is formed, the long arm 16 of the projecting arm 11 is not contorted and in particular is not twisted.

Figure 2:
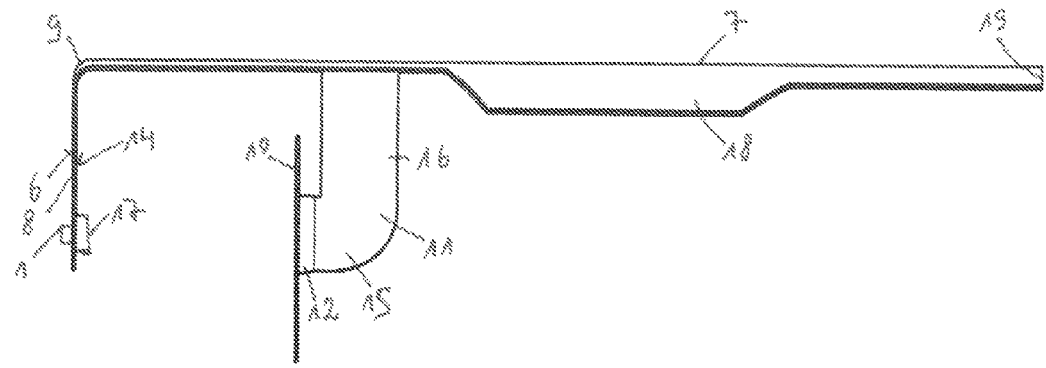
FIG. 2 shows a perspective side view of the exemplary embodiment from FIG. 1.

The sensor part further includes a mirror element, which is arranged on a second side 14 of the support 5 opposing the first side 6 of the support 5, opposite the reference detector 3 and the reference source 2. The arrangement of the mirror element can be seen in FIG. 2 and is designated by a reference numeral '17'. In the illustration of FIG. 2, the mirror element is indicated as projecting beyond the surface of the second side 14, but it should be noted that the mirror element is formed by a section of the material of the support, in particular by an exposed metal section of the flex circuit board, which includes a metal layer, so takes the form of a depression in the second side 14 in the region of the detector section 8. In this case, the flex circuit board includes a plurality of metal layers and a cover comprising a transparent insulator. If the insulator is removed, one of the metal layers, for example a nickel or gold layer of the flex circuit board, is exposed, with the result that the exposed metal layer acts as the mirror element. FIG. 2 further shows that the mirror element 17 is arranged on the opposite side of the detector section 8 to the detector 1.

FIG. 1 further shows that the main section 7 includes a broadened section 18. In this broadened section, the extent of the main section perpendicular to its longitudinal extent is made greater, and in particular the breadth of the main section is doubled. The broadened section 18 has an approximately trapezoidal outline and extends to either side of the main section 7. Electronic elements for which there is insufficient space for example on the detector section 8 or the reference section 10 are arranged on the broadened section 18.

FIG. 1 further shows that the main section 7 has a convex shape transversely in relation to its extent (arrow 4). The radius of curvature of the convex shape is selected in relation to the radius of curvature of the circle segment of the outline of the reference section 10 such that the reference section 10 lies within the circle outline described by the convex shape, as shown by the plan view in the direction of view of incident radiation (arrow 4) in FIG. 3.

The convex shape of the main section 7 merges into the broadened sections 18 to either side of the main section 7, as shown by the side view of FIG. 2. The convex shape extends from one end 19 of the main section 7 (FIG. 2) over approximately two thirds of the longitudinal extent of the main section 7 as far as the point at which the projecting arm 11 turns away at an angle from the main section. Between the projecting arm 11 and the second end of the main section 7 at which the second bending edge 9 is arranged, the main section 7 extends substantially flat, that is to say with no bending.

The support 5 that is described above has a body that is bent at three sections, namely in the region of the first bending edge 12, in the region of the second bending edge 9 and in the region of the arched long arm 16 of the projecting arm 11. The convex shape that is described above is only optionally provided, and in particular it may be provided for the main section 7 to take a flat form along its entire extent.

The detector 1, the reference detector 3 and the at least one reference source 2 each take the form of compact electronic components, in particular so-called dies. The detector 1 is secured to the surface of the detector section 8 by means of an electrically conductive adhesive, thus making an electrically conductive connection. The detector 1 is further connected to the electrical lines in the flex circuit board by means of a bonding procedure. The same applies to the reference detector 3 and the reference sources. In this case, the flex circuit board is approximately 300 microns thick, with the result that it is readily bendable and in particular may be bent in the region of the two bending edges 9, 12 around approximately 90° and forms a substantially linear bending edge 9, 12, and these respectively extend transversely in relation to the extent of the short arm 15 of the projecting arm 11 and transversely in relation to the extent of the main section 7 of the support 5.

The detector section 8 has two cover arms, whereof one is designated by the reference numeral '20'. This gives the detector section 8 a substantially Y-shaped outline, wherein the detector 1 is arranged at the point where the two cover arms 20 meet. As can be seen from FIG. 3, which shows a plan view in the direction of view of the incident ray (arrow 4 in FIG. 1), the two cover arms 20 of the detector section 8 lie partly over the reference sources 2 that are arranged on the reference section 10, as indicated for the reference source 2. The mutual arrangement of the cover arms 20 and the reference sources 2 to either side of the reference detector 3 is such that the infrared radiation emitted by the reference sources 2 is reflected at the side of the detector section pointing toward the reference section 10.

The sensor part that is illustrated from different directions of view in FIGS. 1 to 3 is part of an infrared sensor (not illustrated in more detail). In particular, the sensor part is received in a sleeve, which is filled with a gel that is permeable to IR radiation and is for example based on silicone, with the result that the mutual positions of the detector 1, the reference detector 3 and the reference sources 2 do not change. Further, the gel expels oxygen and water vapor from the interior of the sleeve. The IR sensor further includes electrical lines (not illustrated in the drawings) for the electrical connection of the IR sensor. Further, the IR sensor includes a cover which is permeable to IR, in particular a sapphire plate which closes off the sleeve toward one end side.

The sensor part that is described above in this case produced as follows:

In a first method step, a substantially flat section of a flexible material, in particular a flat section of the flex circuit board, is provided as the support 5. This flat section already has the main section 7, the projecting arm 11, the detector section 8 and the reference section 10. The electrical contacts for the detector 1, the reference detector 3 and the reference source 2 have already been provided on the flex circuit board.

In a second method step, the IR-sensitive detector 1 is on a first section of the body of the support 5, in particular a detector section 8 of the body of the support 5, and the at least one reference source 2 and the IR-sensitive reference detector 3 are on a second section of the body of the support 5, in particular the reference support 10, wherein the second section or the reference support 10 is connected to a main section 7 of the body of the support 5 by way of a projecting arm 11. The order in which the detector 1, the reference detector 3 and the reference source 2 are secured is not crucial. The detector 1 is secured by applying an electrically conductive adhesive, wherein the detector 1 is subsequently connected to the electrical line on the flex circuit board by bonding. The reference detector 3 and the at least one reference source 2 are electrically connected accordingly. The intermediate product that is obtained from this, in which the support 5 is flat, is illustrated in FIG. 4.

Figure 4:
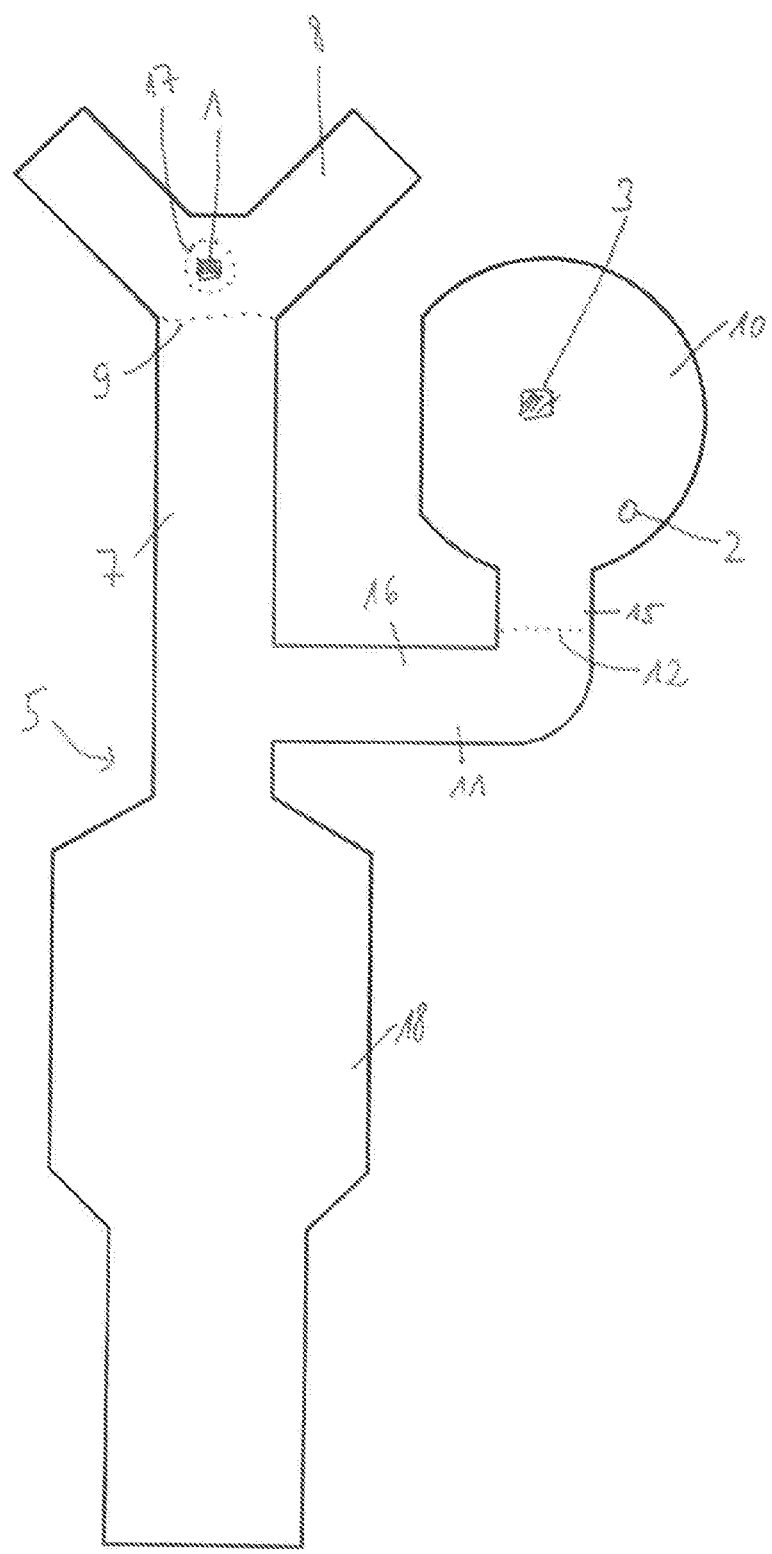
FIG. 4 shows a plan view of an intermediate product that is created when the method according to the invention is performed in producing the exemplary embodiment illustrated in FIG. 1 to FIG. 3.

In a third method step, the first bending edge 12 is formed, by means of which the second section, in particular the reference section 10, is moved substantially away from the projecting arm 11; to refer to the illustration in FIG. 4, for this purpose the reference section 10 is bent into the plane of the paper, with the result that in the region of the short arm 15 of the projecting arm 11 the first bending edge 12 is formed as a linear edge.

Thereafter, in a fourth method step, the long arm 16 is arched into the plane of the paper to form an annular segment, with the result that the annular segment describes approximately a quarter of a circle.

In a fifth method step, a second bending edge 9 is formed by means of which the first section, which receives the detector 1, in particular the detector section 8, is moved away from the rest of the body of the support 5, in particular by means of the bending edge moving the detector section 8 away from the main section 7. To form the second bending edge 9, the detector section 8 is bent into the plane of the paper around approximately 90°, with the result that the substantially linear second bending edge 9 is formed at one end of the main section 7.

In the performance of the method, it will be appreciated here that the order in which the third, fourth and fifth method steps are performed may be modified.

Formation of the second bending edge 9, the first bending edge 12, and the arching of the projecting arm 11, in particular arching of the long arm 16 of the projecting arm 11, are performed such that the detector 1 is spaced in the direction of incidence of the radiation (arrow 4) from the moved-away section 10 having the reference sensor 3 and the at least one reference source 2, in particular such that in a direction of view in the direction of incidence of the ray (arrow 4, FIG. 1) the detector section 8, in particular the cover arms 20 thereof, lies partly over the reference section 10, wherein the cover arms 20 lie partly only over the at least one reference source 2 but not over the reference detector 3. Further, the reference section 10 is aligned substantially parallel to the detector section 8.

The sensor part that is produced in this way may optionally also be given a convex shape, for example in the region of the main part 7 of the body of the support 5.

It will be appreciated that, in performing the method described, it is possible to provide a mirror element, for example the mirror element 17 that is described above, which may be provided on the second side 14 of the support 5, in the region of the detector section 8, opposite the detector 1 that is arranged on the first side 6, wherein the mirror element 17 is formed by an exposed metal section of the flex circuit board. Here, it is appropriate to provide the flex circuit board or the support 5 with the mirror element 17 at an early stage, before the first method step, that is to say to expose the section of the flex circuit board that forms the mirror element 17 at this early stage. This section is hidden in the illustration of FIG. 4, in which the mirror element 17 is indicated by a dashed circle.

It will further be appreciated that, in performing the method described, in addition to the detector 1, the at least one reference source 2 and the reference detector 3, further electronic components may be secured to the support 5, for example in the region of the broadened sections 18, which extend to either side of the main section 7.

LIST OF REFERENCE NUMERALS

1 Detector
2 Reference source
3 Reference detector
4 Direction of incident ray (arrow)
5 Support
6 First side of the support 5
7 Main section
8 Detector section
9 Second bending edge
10 Reference section
11 Projecting arm
12 First bending edge
13 Straight section
14 Second side of the support 5
15 Short arm of the projecting arm 11
16 Long arm of the projecting arm 11
17 Mirror element
18 Broadened section
19 End of the main section 7
20 Cover arm

The invention claimed is:

1. A sensor part for an infrared sensor, comprising: an IR-sensitive detector, at least one reference source that emits IR radiation, and an IR-sensitive reference detector that is spaced in a direction of incidence of the IR radiation from the detector, wherein the at least one reference source is arranged to a side of the reference detector, and a support on a first side on which the detector, the at least one reference source, and the reference detector are arranged, the support includes a blank of a flexible material with bent sections, a body of the support includes a main section, which extends in the direction of incident radiation, and a reference section, the reference section is arranged on a projecting arm, the projecting arm is connected to the main section, and the reference section projects away from the projecting arm at a first bending edge at an angle, and the reference section has an outline in a shape of a circle segment.

2. The sensor part as claimed in claim 1, wherein the projecting arm is bent in a shape of an annular segment.

3. The sensor part as claimed in claim 1, wherein the projecting arm has a substantially L-shaped form, the reference section is arranged at one end of a short arm of the L-shaped form, and the main section is arranged at one end of a long arm.

4. An IR sensor, including a sensor part as claimed in claim 1.

5. The sensor part as claimed in claim 1, wherein the blank is a flex circuit board.

6. A sensor part for an infrared sensor, comprising: an IR-sensitive detector, at least one reference source that emits IR radiation, and an IR-sensitive reference detector that is spaced in a direction of incidence of the IR radiation from the detector, wherein the at least one reference source is arranged to a side of the reference detector, and a support on a first side on which the detector, the at least one reference source, and the reference detector are arranged, the support includes a blank of a flexible material with bent sections, wherein a body of the support includes a main section, which extends in the direction of incident radiation, and a detector section, the detector is arranged on the detector section, and the detector section projects away from the main section at a second bending edge at an angle, and the main section has at least in certain sections a convex shape transversely in relation to its extent.

7. The sensor part as claimed in claim 6, further comprising a mirror element, which is arranged on a second side of the support opposing the first side of the support, opposite the reference detector and the at least one reference source.

8. The sensor part as claimed in claim 7, wherein the mirror element is arranged on an opposite side of the detector section to the detector.

9. The sensor part as claimed in claim 7, wherein the mirror element is formed by a section of the material of the support.

10. The sensor part as claimed in claim 9, wherein the blank is a flex circuit board, and the mirror element is formed by an exposed metal section of the flex circuit board that includes a metal layer.

11. The sensor part as claimed in claim 6, wherein the main section includes a broadened section.

12. A method for producing a sensor part for an IR sensor, in particular for producing a sensor part as claimed in claim 1, comprising the following steps: providing a substantially flat section of the flexible material as the support, securing an IR-sensitive detector to a first section of a body of the support, securing the at least one reference source that emits IR radiation and the IR-sensitive reference detector to a second section of the body of the support, wherein the second section is connected to a main section of the body of the support by a projecting arm, and the main section has at least in certain sections a convex shape transversely in relation to its extent, forming a first bending edge by which the second section is moved away from the projecting arm, arching the projecting arm to form an annular segment, forming a second bending edge by which the first section is moved away from the rest of the body of the support by which a detector section is moved away from the main section, wherein formation of the first bending edge, the second bending edge, and the arching of the projecting arm are performed such that the detector is spaced in the direction of incidence of the radiation from the second section having the reference sensor and the at least one reference source.

* * * * *